(12) United States Patent
Mizukami et al.

(10) Patent No.: US 9,337,035 B2
(45) Date of Patent: May 10, 2016

(54) SEMICONDUCTOR DEVICE AND METHOD OF MANUFACTURING THE SAME

(71) Applicant: KABUSHIKI KAISHA TOSHIBA, Tokyo (JP)

(72) Inventors: Makoto Mizukami, Igo Hyogo (JP); Takuma Suzuki, Himeji Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/636,101

(22) Filed: Mar. 2, 2015

(65) Prior Publication Data
US 2015/0263086 A1 Sep. 17, 2015

(30) Foreign Application Priority Data
Mar. 14, 2014 (JP) ................................. 2014-051899

(51) Int. Cl.
| H01L 29/06 | (2006.01) |
| H01L 21/04 | (2006.01) |
| H01L 29/868 | (2006.01) |
| H01L 29/861 | (2006.01) |
| H01L 29/66 | (2006.01) |
| H01L 29/16 | (2006.01) |
| H01L 29/32 | (2006.01) |

(52) U.S. Cl.
CPC ........ *H01L 21/0455* (2013.01); *H01L 29/0649* (2013.01); *H01L 29/66136* (2013.01); *H01L 29/861* (2013.01); *H01L 29/868* (2013.01); *H01L 29/1608* (2013.01); *H01L 29/32* (2013.01)

(58) Field of Classification Search
None
See application file for complete search history.

(56) References Cited

U.S. PATENT DOCUMENTS

| 7,737,011 | B2 | 6/2010 | Tsuchida et al. | |
|---|---|---|---|---|
| 8,012,837 | B2 | 9/2011 | Nishio et al. | |
| 8,835,288 | B2 | 9/2014 | Nishio et al. | |
| 9,245,944 | B2 * | 1/2016 | Rupp | H01L 29/0607 |
| 2011/0284871 | A1 * | 11/2011 | Harada | H01L 21/02529 257/77 |
| 2013/0183820 | A1 * | 7/2013 | Hiyoshi | H01L 21/3065 438/589 |
| 2014/0070369 | A1 * | 3/2014 | Kitamura | H01L 21/22 257/607 |

FOREIGN PATENT DOCUMENTS

| JP | 2009-272328 A | 11/2009 |
| JP | 2011-109018 A | 6/2011 |

(Continued)

OTHER PUBLICATIONS

T. Hiyoshi et al., "Reduction of Deep Levels and Improvement of Carrier Lifetime in n-Type 4H-SiC Thermal Oxidation", Applied Physics Express 2 (2009) 041101.

T. Kimoto et al., "Lifetime-killing defects in 4H-SiC epilayers and lifetime control by low-energy electron irradiation", phys. stat. sol. (b) 245, No. 7, 1327-1336 (2008)/DOI 10.1002/pssb. 200844076.

(Continued)

*Primary Examiner* — Minh-Loan Tran
(74) *Attorney, Agent, or Firm* — Patterson & Sheridan, LLP

(57) ABSTRACT

A semiconductor device includes a first electrode, a second electrode, a first semiconductor layer of a first conductivity type located between the first electrode and the second electrode and having a region in which a carbon vacancy density becomes lower in a first direction from the first electrode to the second electrode, a second semiconductor layer of the first conductivity type located between the first electrode and the first semiconductor layer and having an impurity element concentration higher than the impurity element concentration of the first semiconductor layer, and a plurality of third semiconductor layers of a second conductivity type located between the second electrode and the first semiconductor layer.

15 Claims, 9 Drawing Sheets

(56) References Cited

FOREIGN PATENT DOCUMENTS

| | | |
|---|---|---|
| JP | 2013-048247 | 3/2013 |
| WO | 2010-024239 A1 | 3/2010 |

OTHER PUBLICATIONS

B. Zippelius, et al., "High temperature annealing of n-type 4H-SiC: Impact on intrinsic defects and carrier lifetime", Journal of Applied Physics 111, 033515 (2012); doi: 10.1063/1.3681806, 6 pages.

* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2014-051899, filed Mar. 14, 2014, the entire contents of which are incorporated herein by reference.

FIELD

Embodiments described herein relate generally to a semiconductor device and a method of manufacturing the same.

BACKGROUND

For a semiconductor device using silicon carbide (SiC), high temperature annealing is required in the manufacturing process thereof. However, it is found that when high temperature annealing is performed, the number of carbon vacancies in which carbon is deficient is necessarily increased in the silicon carbide. The carbon vacancy has the property of capturing minority carriers and thus reduces the lifetime of the minority carriers flowing in an element. Accordingly, the on-resistance of the device is raised in some cases. Therefore, in the semiconductor device using silicon carbide, it is desirable to decrease the number of carbon vacancies as much as possible.

DETAILED DESCRIPTION

Embodiments provide a semiconductor device capable of reducing on-resistance.

In general, according to one embodiment, a semiconductor device includes: a first electrode; a second electrode; a first semiconductor layer of a first conductivity type located between the first electrode and the second electrode and having a region in which a carbon vacancy density becomes lower in a first direction from the first electrode to the second electrode; a second semiconductor layer of the first conductivity type located between the first electrode and the first semiconductor layer and having an impurity element concentration higher than the impurity element concentration of the first semiconductor layer; and a plurality of third semiconductor layers of a second conductivity type located between the second electrode and the first semiconductor layer.

(First Embodiment)

Embodiments will be described hereinafter with reference to the drawings. In the following description, the same reference numbers are applied to the same elements, and the description of previously described elements will be omitted as appropriate.

Figure 1A:
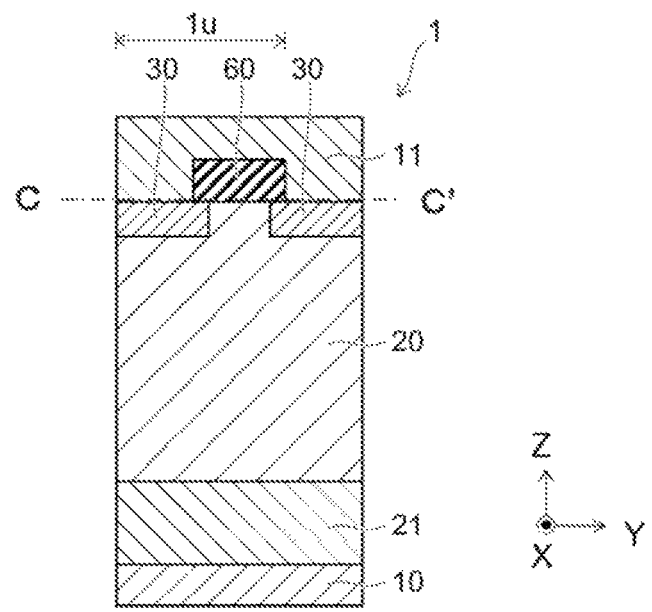
FIGS. 1A and 1B are schematic cross-sectional views showing a semiconductor device according to an embodiment.
Figure 1B:
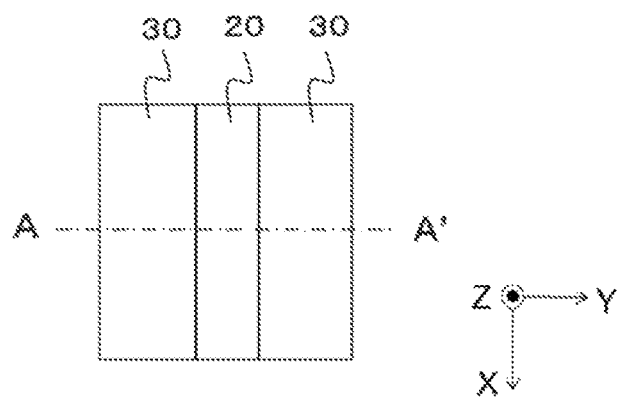

FIGS. 1A and 1B are schematic cross-sectional views showing a semiconductor device according to an embodiment.

Here, FIG. 1A shows a cross-sectional view taken along the line A-A' of FIG. 1B. FIG. 1B shows a cross-sectional view taken along the line C-C' of FIG. 1A.

A semiconductor device 1 is a pin diode having a vertical electrode structure. A length 1$u$ indicated by an arrow in FIG. 1A is the minimum unit of the semiconductor device 1 and a plurality of such units 1$u$ are aligned in a Y-direction.

The semiconductor device 1 includes a cathode electrode 10 (first electrode) and an anode electrode 11 (second electrode). An n− type semiconductor layer 20 (first semiconductor layer) is provided between the cathode electrode 10 and the anode electrode 11. The semiconductor layer 20 corresponds to an i-region of the p-i-n diode.

The semiconductor device 1 has a region in which the carbon vacancy density in the semiconductor layer 20 becomes lower in the Z-direction from the cathode electrode 10 to the anode electrode 11 (first direction) (which will be described later), i.e., the carbon vacancy density in the semiconductor layer 20 is higher adjacent to the anode electrode 11 than it is adjacent to the cathode electrode 10.

An n+ type semiconductor layer 21 (second semiconductor layer) is provided between the cathode electrode 10 and the semiconductor layer 20. The n type dopant concentration of the semiconductor layer 21 is higher than the n type dopant concentration of the semiconductor layer 20. The semiconductor layer 21 is in contact with the cathode electrode 10.

A p+ type semiconductor layer 30 (third semiconductor layer) is selectively provided between the semiconductor layer 20 and the anode electrode 11. The semiconductor layer 30 comprises plural discrete regions and each of the plural regions is spaced from one another along the Y-direction. The plural semiconductor layers 30 extend in the X-direction (third direction) (FIG. 1B).

In addition, the semiconductor layer 20 is interposed, i.e., extends between, adjacent semiconductor layers 30 spaced apart in the Y-direction. An oxide layer 60 is provided between the semiconductor layer 20 extending between the adjacent semiconductor layers 30 in the Y direction and the anode electrode 11. The oxide layer may also extend over portions of the adjacent semiconductor layers 30 at a location immediately adjacent to the portion of the semiconductor layer 20 extending between the adjacent semiconductor layers 30, so as to ensure that the semiconductor layer 20 is not in direct contact with anode electrode 11.

In the embodiment, the n+ type and n type may be referred to as a first conductivity type and the p+ type may be referred to as a second conductivity type. Here, it is noted that the dopant concentration of the semiconductor layers becomes lower in the order of n+ type and n type.

The aforementioned "dopant concentration" refers to an effective concentration of a dopant element contributing to conductivity of a semiconductor material. For example, when a dopant element as a donor and a dopant element as an acceptor are contained in a semiconductor material, the impurity concentration means the concentration in which a canceling part of the donor and the acceptor dopants are excluded from the consideration of the dopant concentration.

The main component of each of the semiconductor layer 20, the semiconductor layer 21, and the semiconductor layer 30 is, for example, silicon carbide (SiC). As a dopant element of a first conductivity type, for example, nitrogen (N) or the like is used. As a dopant element of a second conductivity type, for example, aluminum (Al) or the like is used.

Examples of the material for the cathode electrode 10 and the anode electrode 11 include metals including at least one selected from the group including aluminum (Al), titanium (Ti), nickel (Ni), tungsten (W), molybdenum (Mo), copper (Cu), gold (Au), and platinum (Pt). These metals may have a layered structure. The material for the oxide layer 60 includes silicon oxide, silicon oxide containing carbon, and silicon nitride.

Before a process of manufacturing the semiconductor device according to the embodiment is described, a process of manufacturing a semiconductor device according to a reference example will be described.

Figure 2A:
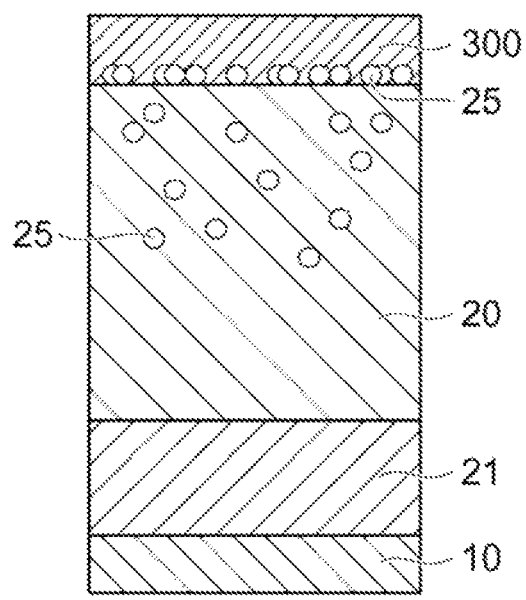
FIGS. 2A to 2C are schematic cross-sectional views showing a process of manufacturing a semiconductor device according to a reference example.
Figure 2A:
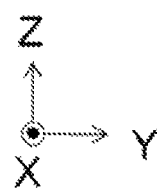
Figure 2B:
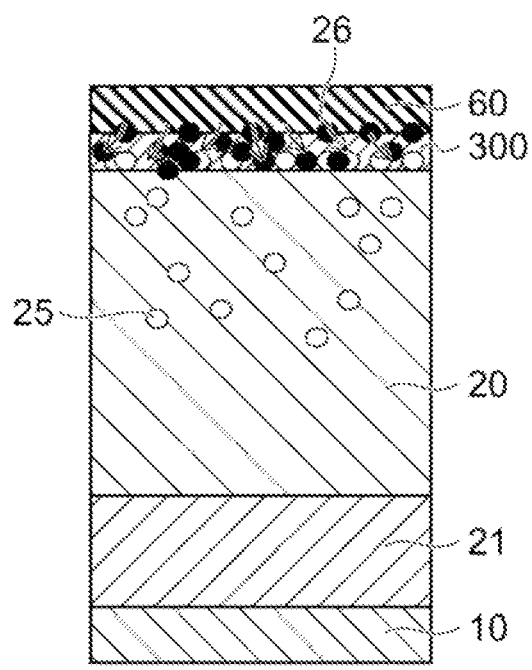
Figure 2C:
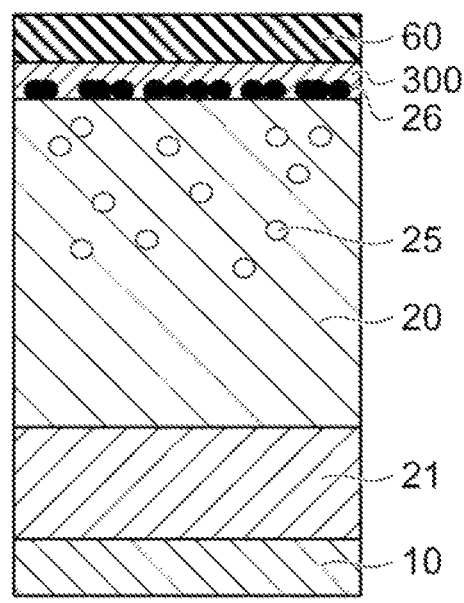

FIGS. 2A to 2C are schematic cross-sectional views showing the results of a process of manufacturing a semiconductor device according to a reference example.

First, in the reference example, as shown in FIG. 2A, aluminum ions are implanted into the surface of the semiconductor layer 20 and annealing is performed for activation of the aluminum ions as a dopant. A p+ type semiconductor layer 300 is then formed on the semiconductor layer 20.

Here, a 4H—SiC crystal included in the semiconductor layer 20 means a crystal in which silicon (Si) and carbon (C) atoms are not completely bonded in a one-to-one relationship and carbon vacancies 25 are present in the crystal lattice. For example, the carbon vacancies 25 are point defects called Z1/2. One factor causing the carbon vacancies 25 is high temperature annealing necessarily occurring during the manufacturing process. Further, due to the aforementioned aluminum ion implantation, various defects are increased in the semiconductor layer 300 in some cases.

A carbon vacancy 25 has the property of capturing minority carriers and thus reducing the lifetime of the minority carriers (for example, holes) flowing in an element. Accordingly, the on-resistance of the device is increased in some cases.

In order to prevent these defects, as shown in FIG. 2B, a method of forming an oxide layer 60 on the semiconductor layer 300 by heating the surface of the semiconductor layer 300 in an oxidizing atmosphere is used. The oxide layer 60 is formed by, for example, a thermal oxidation method (at a temperature of 1300° C. for several hours) wherein a portion of the semiconductor layer 300 exposed to oxygen at the elevated temperature is converted into a semiconductor-oxide compound.

Due to the surface oxidation of the semiconductor layer 300, the oxide layer 60 grows and COx diffuses to the outside of the semiconductor layer 300 as a gas, and also some of carbon atoms 26 in the region being converted to an oxide are diffused into the semiconductor layer 300 and the semiconductor layer 20.

Due to the diffusion of the carbon atoms 26, the carbon atoms 26 enter and are captured in the carbon vacancies 25 in semiconductor layer 20 and the number of the carbon vacancies 25 is reduced. Thus, it is considered that the aforementioned lifetime reduction may be suppressed.

However, as shown in FIG. 2C, carbon atoms 26 can become trapped and thus are not sufficiently diffused into the semiconductor layer 20 in some cases. That is, in the method of the reference example, there is a high possibility that problems of lifetime reduction cannot be resolved.

On the contrary, FIGS. 3A to 3D are schematic cross-sectional views showing the results of a process of manufacturing the semiconductor device according to the embodiment.

Figure 3A:
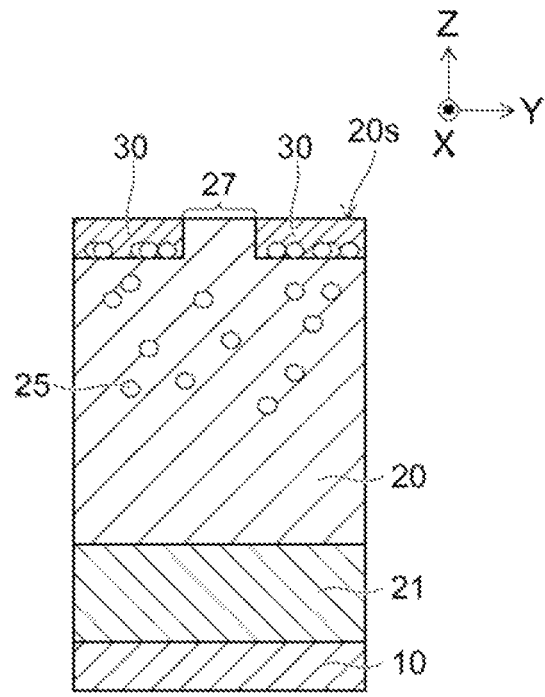
FIGS. 3A to 3D are schematic cross-sectional views showing a process of manufacturing the semiconductor device according to the embodiment.

In the embodiment, first, as shown in FIG. 3A, the semiconductor layer 20 and the semiconductor layer 21 which is in contact with the semiconductor layer 20 are prepared. The surface of semiconductor layer 20 opposed to semiconductor layer 21 is selectively masked, Subsequently, a p type dopant element (aluminum ions) is selectively introduced into a surface 20s of the semiconductor layer 20 opposite to the semiconductor layer 21 by an ion implantation method leaving the portion of semiconductor layer 20 extending between semiconductor layers 30 which was covered by a mask not implanted by Al ions. As a result of ion implantation, as is shown in FIG. 3A, the plural semiconductor layers 30 which are in contact with the semiconductor layer 20 are formed. Here, the conductivity type of the plural semiconductor layers 30 is a p+ type (Aluminum doped SiC). In addition, during the p type dopant element implantation, crystal defects are further increased in the semiconductor layer 30.

However, in the embodiment, since the plural semiconductor layers 30 are spaced apart in the Y-direction, the surface of the semiconductor layer 20 interposed between the adjacent semiconductor layers 30 is exposed (for example, a region 27 of FIG. 3A).

Figure 3B:
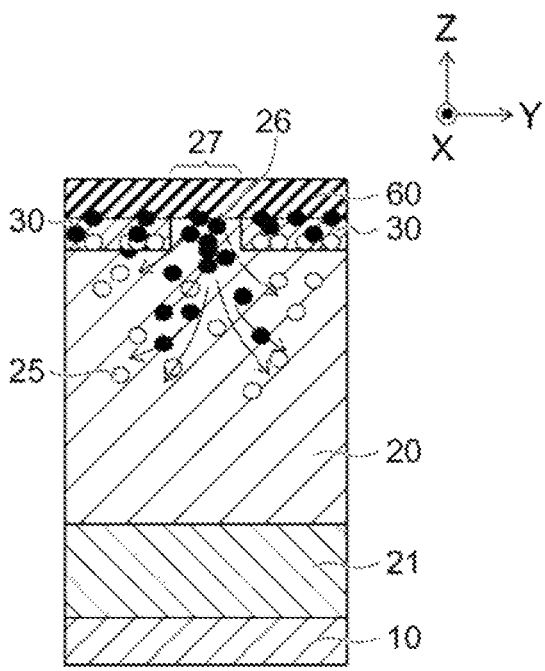

Next, as shown in FIG. 3B, the semiconductor layer 20 and the plural semiconductor layers 30 are heated in an oxidizing atmosphere. Thus, the oxide layer 60 which is in contact with the semiconductor layer 20 and the plural semiconductor layers 30 is formed and also the carbon atoms 26 are diffused from the interface of the semiconductor layer 20 and semiconductor layer 30 in the direction of the semiconductor layer 21.

Figure 3C:
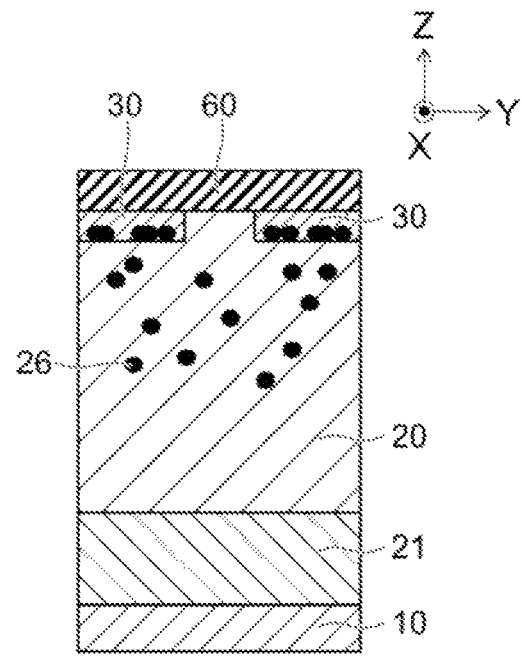

Here, in the embodiment, the semiconductor layer 30 does not extend across the region 27. Therefore, the carbon atoms 26 do not interfere with the carbon vacancies 25 remaining in the semiconductor layer 30 in the region 27. That is, the carbon atoms 26 are diffused deeply into the semiconductor layer 20. The state after the carbon atoms are diffused is shown in FIG. 3C.

Figure 3D:
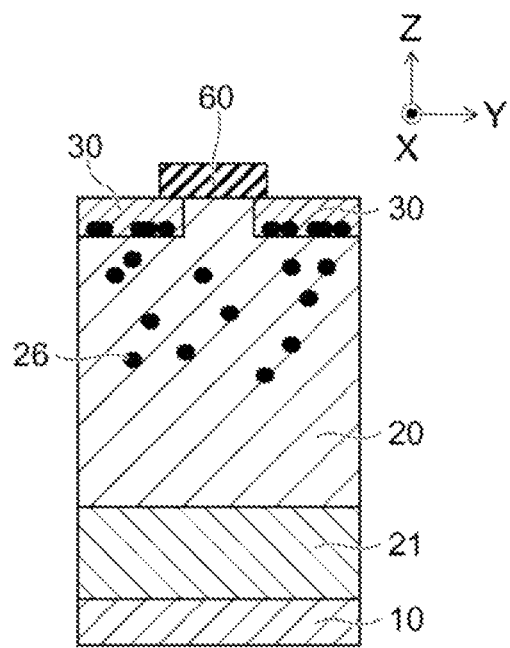

Then, as shown in FIG. 3D, a portion of the oxide layer 60 overlying the semiconductor layers 30 is removed by pattern etching through a mask, exposing the semiconductor layers 30 to either side of the oxide layer 60.

In FIG. 3A, after the p type dopant (aluminum) is selectively introduced by the ion implantation method, or before the p type dopant is selectively introduced, carbon may be introduced into the semiconductor layer 20 and the semiconductor layer 30 by an ion implantation method. There is a correlation between the amount of oxidation and the extension of the lifetime, and an increase in the amount of oxidation to extend the lifetime leads a reduction in the thickness of the impurity layer formed on the surface by oxidation, which causes a problem of difficulties in tuning of properties.

However, during implanting of C atoms into silicon, in order to increase the amount of the carbon atoms 26 diffused into the semiconductor layer 20, the amount of diffusion may be adjusted by increasing the amount of carbon implanted and thus the thickness of the impurity layer formed on the surface is not reduced.

Further, carrier lifetime is correlated with the lifetime of minority carriers implanted into the semiconductor layer 20. When the lifetime becomes longer, a trade-off in which while the conduction loss is reduced and the switching loss is increased occurs. In order to make the lifetime be most suitable for element properties with respect to the trade-off, the amount of implantation may be arbitrarily adjusted by the carbon ion implantation method.

Figure 4:
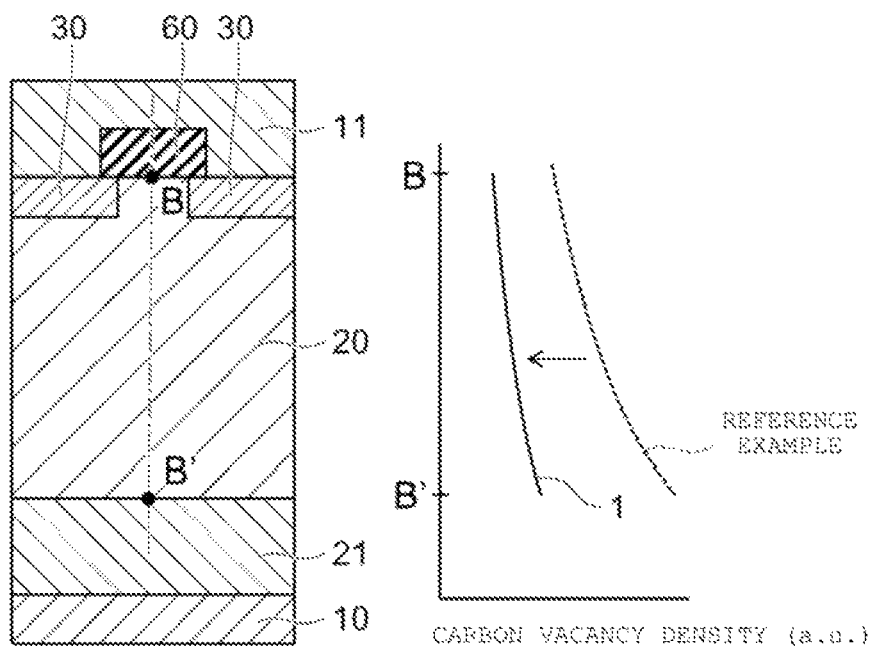
FIG. 4 is a schematic view showing a carbon vacancy density in a silicon carbide region of a first conductivity type.
Figure 4:
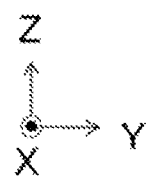

FIG. 4 is a schematic view showing a carbon vacancy density in a silicon carbide region of a first conductivity type.

In FIG. 4, as an example, an arbitrary value (a.u.) of the carbon vacancy density (/cm$^3$) between the points B-B' is shown.

(Second Embodiment)

Figure 5A:
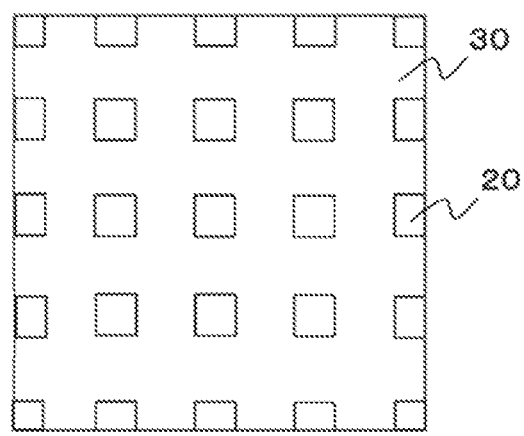
FIGS. 5A and 5B are schematic cross-sectional views showing a semiconductor device according to an embodiment.
Figure 5B:
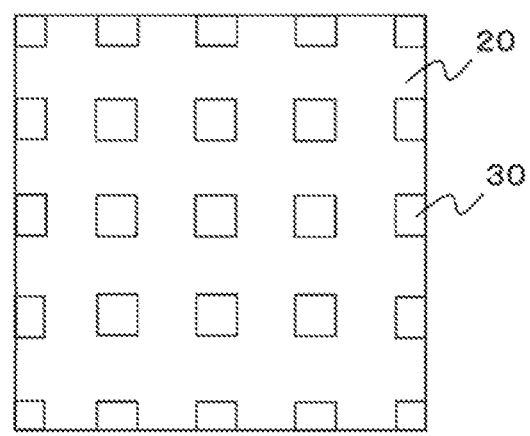

A semiconductor device according to this embodiment is the same as the first embodiment except that the semiconductor layer 20 extends through the semiconductor layer 30 a lattice pattern, i.e., individual islands of semiconductor layer 20 extend through the semiconductor layer 30 (FIG. 5A), or individual islands of semiconductor layer 30 extend through the semiconductor layer 20 (FIG. 5B). A description of the elements overlapping with those of the first embodiment will be omitted.

FIGS. 5A and 5B are schematic cross-sectional views showing the semiconductor device according to the embodiment. FIGS. 5A and 5B are views corresponding to FIG. 1B of the first embodiment. As shown in FIG. 5A, the semiconductor layer 30 is disposed in a lattice pattern. Accordingly, by increasing the amount of minority carriers implanted when being energized, the resistance of the element may be reduced.

On the other hand, as shown in FIG. 5B, the semiconductor layer 20 may be disposed in a lattice pattern. Thus, the density of the carbon vacancies 25 may be generally reduced and the on-resistance may be further reduced.

(Third Embodiment)

A semiconductor device according to this embodiment is the same as the first embodiment except that the semiconductor layer 20 and the semiconductor layer 30 are disposed in a honey comb pattern. Accordingly, the description of the contents overlapping with those of the first embodiment will be omitted.

Figure 6A:
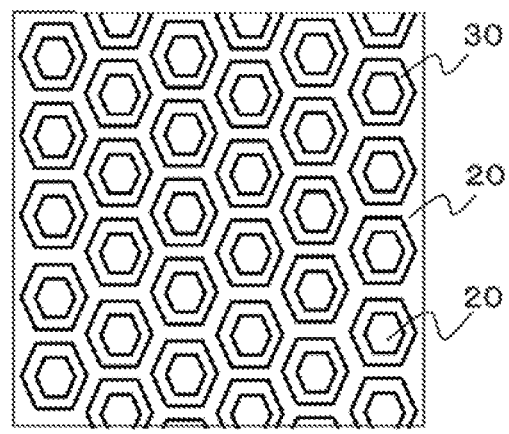
FIGS. 6A and 6B are schematic cross-sectional views showing a semiconductor device according to an embodiment.
Figure 6B:
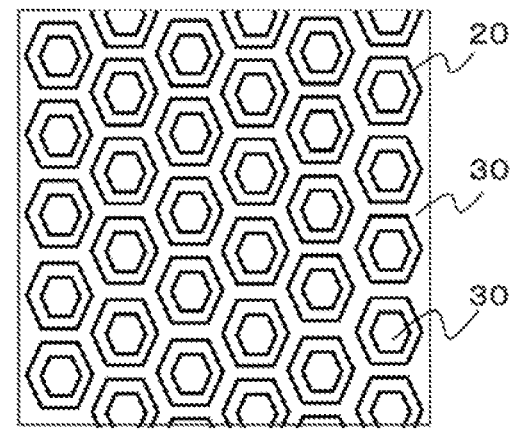

FIGS. 6A and 6B are schematic cross-sectional views showing the semiconductor device according to the embodiment. FIGS. 6A and 6B are views corresponding to FIG. 1B in the first embodiment. As shown in FIG. 6A, the semiconductor layer 20 and the semiconductor layer 30 are disposed in a honey comb pattern. Thus, the semiconductor layer 20 and the semiconductor layer 30 may be disposed at a high density and thus the on-resistance may be reduced. Further, as shown in FIG. 6B, the semiconductor layer 20 and the semiconductor layer 30 may be disposed reversely.

In the semiconductor device 1, compared to the aforementioned reference example, the carbon vacancy density is reduced. Thus, capture of the minority carriers by the carbon vacancies 25 is suppressed and thus a reduction in the lifetime of the minority carriers is prevented. That is, when a forward bias is applied to the semiconductor device 1, holes are injected from the p-type side and electrons are injected from the n-type side. However, the holes do not easily disappear in the semiconductor layer 20 and flow to the n-type side. Accordingly, the on-resistance in the semiconductor device 1 is reduced and thus the current flowing in the semiconductor device 1 is further increased.

As a method of measuring the carbon vacancies 25, a DLTS method and a micro PCD method are used. According to the DLTS method, the amount of defects may be estimated by applying a reverse bias to the pn junction portion and measuring carriers overflowing from a depletion region. At this time, by changing the measurement temperature, carriers having a correlation with a unique defect level overflow and thus the type of defect by the measurement temperature may change the width of the depletion region of the junction portion with a bias to be applied. Thus, information in the depth direction may be obtained by the applied bias. In order to measure the Z1/2 defect, the measurement temperature is preferably a temperature near room temperature.

In addition, according to the micro PCD method, the lifetime of the minority carriers of the SiC semiconductor layer may be measured and the ratio of Z1/2 which is an indirect lifetime indicator may be estimated. At this time, since the penetration depth of the micro OCD measuring method may be adjusted by the wavelength of a laser to be emitted, the lifetime information in the depth direction (Z1/2 density information) may be obtained.

In the above-described embodiment, the term "on" in "a portion A is provided on a portion B" refers to the case in which the portion A is provided on the portion B such that the portion A is in contact with the portion B and the case in which the portion A is provided above the portion B such that the portion A is not in contact with the portion B". Further, the expression "the portion A is provided on the portion B" may be applied to the case in which the portion A is disposed under the portion B by revering the portion A and the portion B and the case in which the portion A and the portion B are horizontally aligned. This is because even when the semiconductor device according to the embodiment is rotated, the structure of the semiconductor device is not changed before and after the rotation.

Hereinabove, embodiments are described with reference to specific examples. However, the embodiments are not limited to the specific examples. That is, one skilled in the art may appropriately make design modifications to these specific examples, and such modifications also are included in the scope of the embodiments to the extent that the features of the embodiments are included. The components of the specific examples described above and the disposition, material, conditions, shape, size, etc. thereof are not limited to those illustrated but may be appropriately altered.

Furthermore, each component included in the above embodiments may be combined within the extent of technical feasibility. Such combinations are also included within the scope of the embodiments as long as the combinations include the features of the embodiments. In addition, one skilled in the art may arrive at various alterations and modifications within the idea of the embodiment. It is understood that such modifications and variations are also included within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first electrode;
   a second electrode;
   a first semiconductor layer of a first conductivity type located between the first electrode and the second electrode and having a region in which a carbon vacancy density becomes lower in a first direction from the first electrode to the second electrode;

a second semiconductor layer of the first conductivity type located between the first electrode and the first semiconductor layer and having an impurity element concentration higher than the impurity element concentration of the first semiconductor layer; and a plurality of third semiconductor layers of a second conductivity type that are located between the second electrode and the first semiconductor layer.

2. The device according to claim 1,
wherein the first semiconductor layer extends between adjacent third semiconductor layers, and
an insulating layer is located between the first semiconductor layer located between the adjacent third semiconductor layers and the second electrode.

3. The device according to claim 2,
wherein the plurality of third semiconductor layers extend in a direction crossing the first direction.

4. The device according to claim 2, wherein the insulating layer further extends over a portion of the third semiconductor layers.

5. The device according to claim 1,
wherein the plurality of third semiconductor layers extend in a direction crossing the first direction.

6. The device according to claim 1, wherein the first semiconductor layer comprises silicon carbide.

7. The device according to claim 6, wherein the second semiconductor layer comprises silicon carbide.

8. The device according to claim 1, wherein the first semiconductor layer is doped with aluminum ions.

9. A PIN diode, comprising:
a first electrode;
a second electrode;
a first semiconductor layer of a first conductivity type located between the first electrode and the second electrode and having a region in which a carbon vacancy density becomes lower in the direction from the first electrode to the second electrode;

a second semiconductor layer of the first conductivity type located between the first electrode and the first semiconductor layer and having an impurity element concentration higher than the impurity element concentration of the first semiconductor layer; and a plurality of third semiconductor layers of a second conductivity type that are located between the second electrode and the first semiconductor layer, wherein the third semiconductor layers are separated by a portion of the first semiconductor layer extending between adjacent third semiconductor layers.

10. The PIN diode of claim 9, further comprising an insulating layer disposed between the portion of the first semiconductor layer extending between adjacent third semiconductor layers and the first electrode.

11. The PIN diode of claim 10, wherein the insulating layer comprises an oxidized first semiconductor layer material.

12. The PIN diode of claim 10, wherein the insulating layer extends over a portion of the third semiconductor layer adjacent to the portion of the first semiconductor layer extending between adjacent third semiconductor layers and the first electrode.

13. The PIN diode of claim 9, wherein the first semiconductor layer includes aluminum.

14. The PIN diode of claim 9, wherein the first semiconductor layer comprises aluminum doped silicon carbide.

15. The PIN diode of claim 9, wherein the second semiconductor layer comprises aluminum doped silicon carbide.

* * * * *